United States Patent [19]

Lewis et al.

[11] 3,935,534

[45] Jan. 27, 1976

[54] CONVERTER-TUNER FOR INFORMATION TRANSMISSION SYSTEM

[75] Inventors: David E. Lewis, Orange; Thomas F. Gossard, Studio City, both of Calif.

[73] Assignee: Columbia Pictures Industries, Inc., New York, N.Y.

[22] Filed: Nov. 15, 1972

[21] Appl. No.: 306,869

[52] U.S. Cl. .............................. 325/308; 325/461
[51] Int. Cl.² ......................................... H04H 1/00
[58] Field of Search ........... 331/161, 162, 154, 158, 331/116 R; 325/31, 308, 439, 461, 388, 436, 437, 184, 416, 438, 309, 452, 460; 178/DIG. 15, 5.6, 6, DIG. 13

[56] References Cited
UNITED STATES PATENTS

| | | | |
|---|---|---|---|
| 2,813,973 | 11/1957 | McCoy et al. | 325/439 |
| 3,167,730 | 1/1965 | Anderson et al. | 331/161 X |
| 3,372,339 | 3/1968 | Harrison et al. | 331/116 R |
| 3,555,430 | 1/1971 | Fischer et al. | 325/308 X |
| 3,581,209 | 5/1971 | Zimmerman et al. | 325/308 |
| 3,581,240 | 5/1971 | Endorby | 331/161 X |
| 3,639,840 | 2/1972 | Shekel et al. | 325/308 |
| 3,643,164 | 2/1972 | Sly et al. | 325/308 |
| 3,696,302 | 10/1972 | Gossard | 325/439 |

*Primary Examiner*—Benedict V. Safourek
*Attorney, Agent, or Firm*—Kenyon & Kenyon Reilly Carr & Chapin

[57] ABSTRACT

An individually addressable converter-tuner station for use in a cable television distribution system for selectively enabling the reception by conversion of at least one secure channel signal on a conventional television receiver. The converter-tuner utilizes a crystal-controlled local oscillator to provide the frequencies for converting the received secure channel carriers to a carrier receivable by the receiver. Initial filtration of the incoming secure channel carriers is accomplished in part by means of a tunable pass band filter, controlled by a variable capacitance diodes. A double balanced mixer is employed to cancel unwanted signals remaining in the filtered input to the mixer. The secure channel carriers are in the television midband range, and the local oscillator frequencies are below that range. Extensive use is made of diode switching of the crystal controlled oscillator and other components.

15 Claims, 8 Drawing Figures

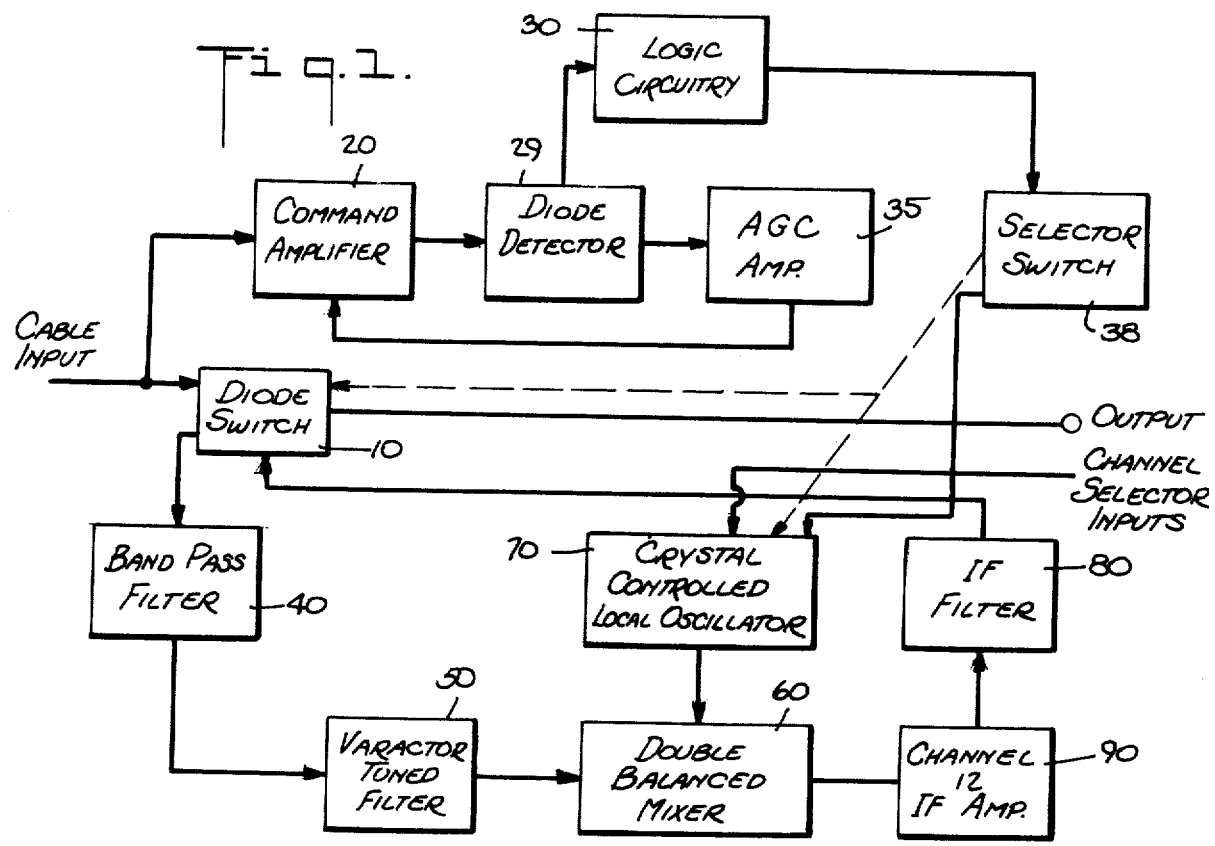
Fig. 1.
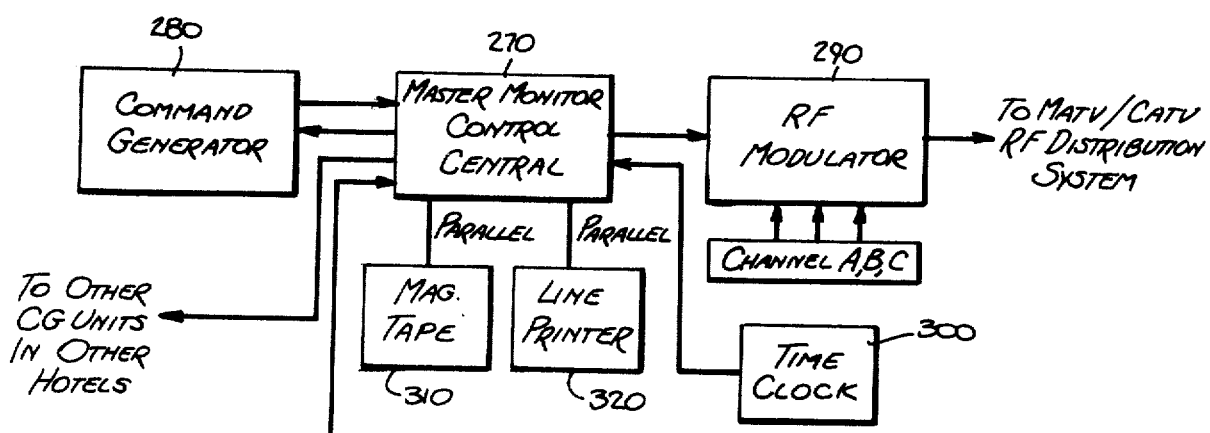
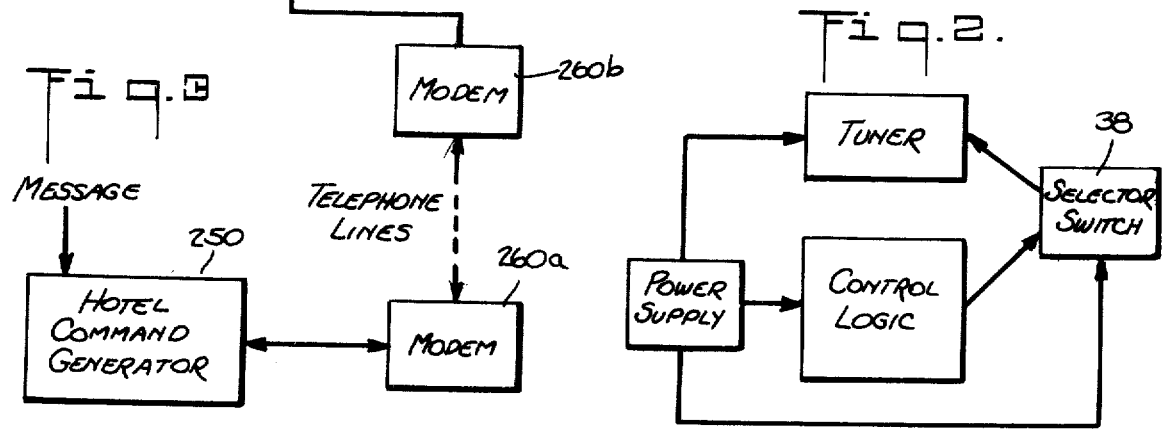
Fig. 3.
Fig. 2.

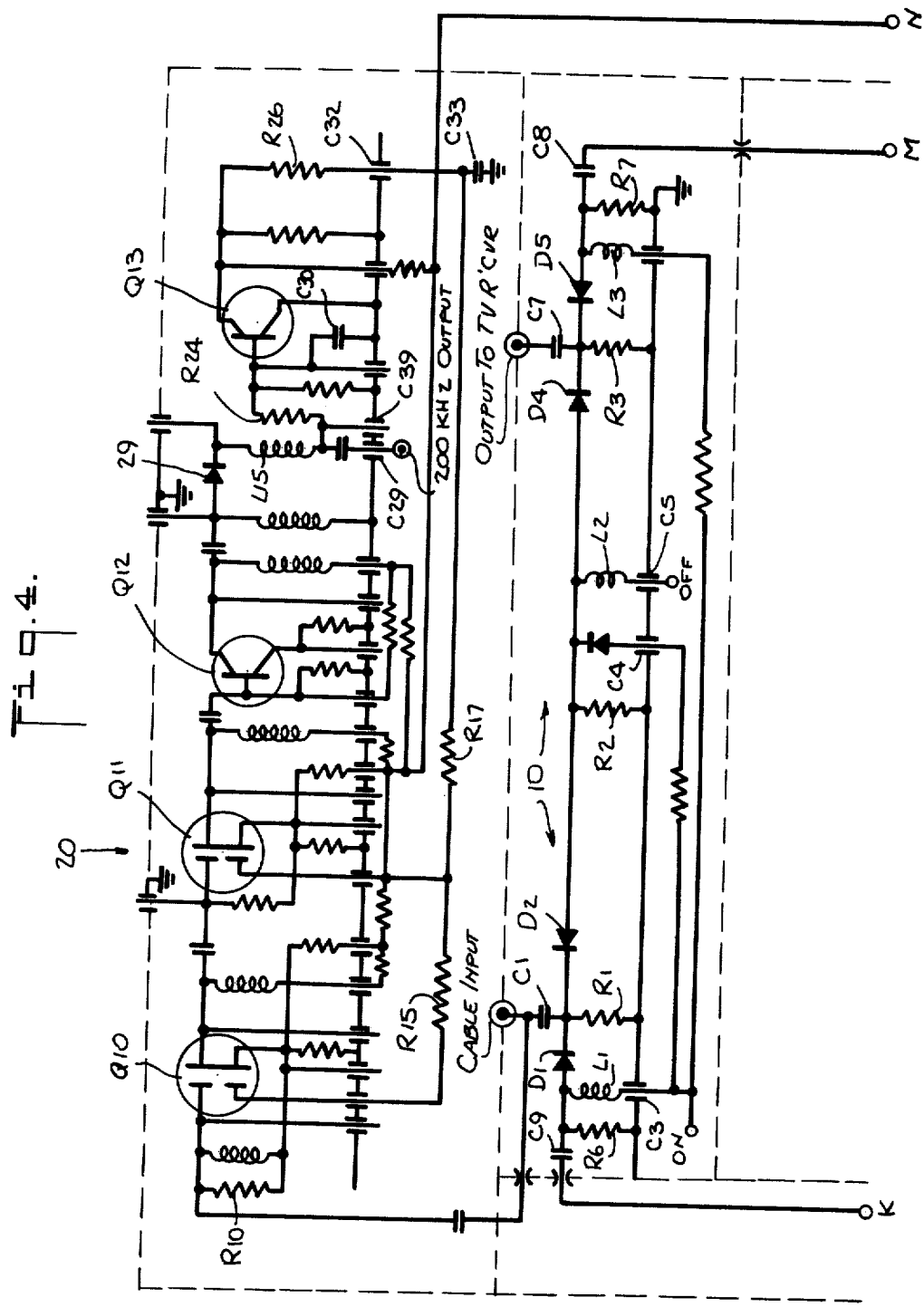

CONVERTER-TUNER FOR INFORMATION TRANSMISSION SYSTEM

BACKGROUND OF THE INVENTION

1. Field of the Invention

This invention relates to the field of information transmission systems, and especially to cable television distribution systems, and more particularly to converter-tuner stations which are individually addressable by means of command word signals on a cable to enable reception of selected secure channel signals carried on the cable.

2. Description of the Prior Art

Many types of tuner-converter units for subscription systems are known. Such units typically provide means for alternately directing the cable input, bearing both standard broadcast and secure channels, directly to the television set, or directing such input through the tuner-converter before presenting it to the input of the receiver. In the former state, the standard broadcast channels are receivable, the secure channels being not receivable because of the fact that their frequencies are outside the broadcast band. In the latter, selected of the secure channels are rendered receivable by conversion on one of these unused standard broadcast channels.

Such a tuner-converter system in the secure channel viewing mode, normally involves filtering the input to strip off the standard broadcast channels, presenting the secure channels to a mixer, and mixing therewith a heterodyning signal generated by a variable local oscillator. This sequence of events, depending on the oscillator frequency chosen, yields a signal which falls within one of the standard broadcast television channels, and which, when directed to the input of the receiver, can be detected.

Several significant problems exist with prior art devices of this type. Firstly, the local oscillator does not have a constant frequency, but tends to drift. This makes necessary the provision of means for fine tuning the local oscillator. Such fine tuning may not be compatible for use with the fine tuning of the television receiver itself. For example, if the local oscillator is fine tuned in an extreme position, it may not be possible to pick up the transmitted secure channel on the television set at all, reception being out of reach of the set's fine tuning adjustment.

Conventionally, the local oscillator frequencies are chosen to be significantly higher than those of the secure channel carriers. This is done in order that the fundamental or harmonic frequencies of the oscillator be maintained above the midband and high band channels, thereby avoiding interference signals which may be picked up by the receiver. The use of local oscillator frequencies above the midband frequencies requires relatively complex circuitry to develop such high frequencies.

Often, unwanted frequencies enter the mixer from the cable, passing through the relatively wide pass band of the filters which preceed it. These extraneous signals cause obvious problems relating to noise and interference in the ultimately received signal.

Fundamental or harmonic frequencies generated by the local oscillator of one station can be propagated onto the main cable system, potentially causing trouble at other subscriber stations. In the past, complex shielding and filtering has been a partial solution to this problem.

Accordingly, it is an object of this invention to provide a converter-tuner having a local oscillator which is relatively drift-free and does not require a fine tuning adjustment of its own.

It is a further object of this invention to provide a converter-tuner for a cable television distribution system incorporating more selective filtration and more precise mixing than is available in the prior art.

It is a further object of this invention to provide means for nullifying the effects of radiated frequencies from the local oscillator into other elements of the system, including the main cable.

It is a further object of this invention to provide a cable distribution television system in which the local oscillator frequencies present only minimal problems of interference and noise in other parts of the system.

SUMMARY OF THE INVENTION

The objects of this invention are fulfilled by the following apparatus, which includes a tuner-converter section and a diode operated switch. The cable input enters the diode operated switch, from which it may be, in one condition of that switch, directly routed to the television receiver. In this way, the standard broadcast television channels can be viewed in a conventional fashion. When the diode switch is in the opposite condition, the cable input is directed to a band pass filter, which strips off all signals having frequencies outside the midband range, i.e., frequencies outside the range of 120 to approximately 165 megacycles. The remaining signals within the pass band of the band pass filter including all the secure channels, are passed to a more selective tuned band pass filter, having a pass band of only about 6 megacycles in width.

The center frequency of the pass band of this filter is adjustable by means of varying the voltage supplied to a varactors (variable capacitance diodes). In this way, the tuned band pass filter can be made to position its pass band to precisely cover the one of the midband secured channels which is to be converted and ultimately viewed. Thus, extremely selective filtering is available to strip off the secure channel carrier signal virtually all extraneous frequencies.

A double balanced mixer is used in the converter of this apparatus. Use of such a mixer is desirable because it can cancel out unwanted frequencies which may have survived the previous filtering steps. The double balanced mixer mixes the local oscillator frequency and the midband secured channel which is also impressed at its other input. From there, the signal is passed through a channel 12 IF amplifier (tuned) and through an additional IF filter, before being presented to the input terminals of the television receiver.

The local oscillator employed in this apparatus is of the crystal controlled type. As such, it is a relatively drift-free oscillator and has no need for its own fine tuning adjustment.

The crystal controlled oscillator is constructed such that it uses the same transistor in converting all secure channels. One of a plurality of crystals is selectively placed into the tank circuit of the transistor, depending on which channel is to be converted. This is accomplished by means of electronic diode switching, under stimulus from the selector switch on the converter apparatus.

The frequencies of the local oscillator which are mixed with the secure channel carrier frequencies are lower than the secured channel carrier frequencies.

This serves to eliminate the complex oscillator circuitry which is necessary in other apparatus in which the oscillator frequencies are higher than the secure channel frequencies.

The secure channel frequencies are chosen such that the oscillator frequencies necessary to convert them to their ultimate frequency will not interfere with that ultimate frequency, or with the midband, where the secure channels are located. Even so, there may arise harmonics of the oscillator frequency which potentially are troublesome in terms of providing interference. Provision is therefore made to provide a resonant circuit associated with the oscillator which resonates in response to radiation from a troublesome harmonic. The resonant circuit is coupled to the band pass filter to apply the radiated problem frequency displaced approximately 180° from the phase of any content of the troublesome harmonic frequency in the channel signal delivered to the band pass filter. In this way the troublesome harmonic frequency content can be nulled.

DESCRIPTION OF THE DRAWINGS

FIG. 1 is a block diagram of the converter-tuner of this invention.

FIG. 2 is a generalized block diagram of the converter-tuner of this invention.

FIG. 3 is a block diagram of the elements of a central command and control system to be used in conjunction with the converter-tuner of the present invention.

FIG. 4 is a partial schematic drawing of the converter-tuner of this invention.

DESCRIPTION OF THE PREFERRED EMBODIMENT

Description of Tuner-Converter

Figure 5:
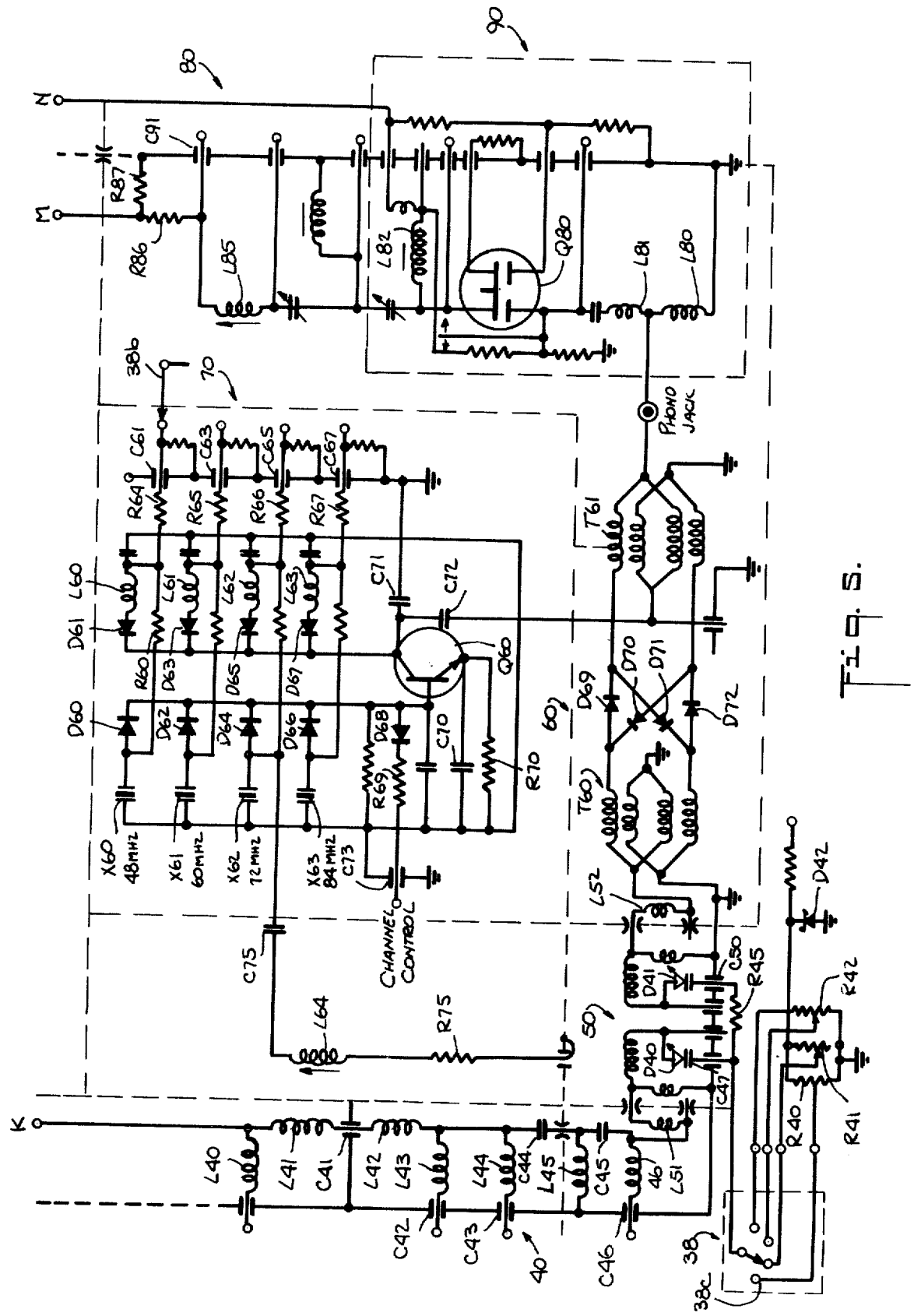
FIG. 5 is a partial schematic drawing of the circuitry of the converter-tuner of this invention, to be used in conjunction with FIG. 4, the circuits of FIGS. 4 and 5 being joined respectively at terminals K, M and N.

Referring now to FIG. 1, there is shown a block diagram of the converter-tuner unit. The input to diode switch 10 is the main cable of the system. In addition to conventionally transmitted standard broadcast television signals, this cable bears one or more carriers in the television midband range, each of which midband carriers is modulated with a different signal. Each midband channel represents one of the secure channels of this system.

Also present on the input cable is a command carrier having, for example, a frequency of 115 megacycles. The command carrier is modulated with a command signal, in the form of 200 khz tone bursts. These tone bursts are timed such that groups of them, when modulated on the command carrier, represent a digital command word. The command word contains both address and command information. The command word is ultimately directed to logic circuitry 30. The logic circuitry in turn generates signals for verifying the address and executing the commands present in the command word.

The tone bursts representing the command word may be modulated on the command frequency in any acceptable fashion, such as by mixing with the command frequency of 115 mhz an additional frequency of 114.8 mhz.

Pin diode switch 10 is essentially a two position switch, controlled by selector switch 38. When in the "off" position (which is described below), switch 10 connects all standard television and secure channels directly to the television receiver by way of the output indicated in FIG. 1. This has the effect of delivering directly to the television set the standard broadcast channels which may then be received in conventional fashion.

Whenever the selector switch is set to a position corresponding to reception of one of the secure channels, switch 10 is electronically set up to deliver the cable input to the converter tuner system, such that the selected one of the secure channels may be converted for reception.

In all cases, the cable input is directed to the input of command amplifier 20. Command amplifier 20 is a tuned RF amplifier which amplifies the command carrier, and the signals modulated thereon, while substantially rejecting the midband carrier frequencies on the input. Diode detector 29 serves to demodulate the tone bursts representing the command word from the amplified command carrier signal. Detector 29 directs the command word tone bursts to logic circuitry 30. Logic circuitry 30 determines whether the address portion of the command word corresponds to the address of its associated converter-tuner, and, if so, further generates signals in response to the command portion of the command word.

By means of cooperation with selector switch 38, the signals generated by logic circuitry 30 in response to the command portions of the command word are appropriately applied to the local oscillator 70 of the converter-tuner unit in order to enable the conversion and reception of a selected one of the secure channel carrier signals, i.e., those channels enabled by the response of logic 30 to the command information.

AGC amplifier 35 generates feedback to command amplifier 20 in order to assist in maintenance of a consistent level of the energy of the demodulated signal.

When the diode switch 10 is in the "on" position, which position it reaches by virtue of selection of any of the secured channels on the selector switch, the cable input signals are directed to band pass filter 40. Band pass filter 40 has a pass band, for example, of from 120 to 165 mhz. As will be discussed, all of the secured channel carrier signals are within this pass band. Band pass filter 40 serves to reject the command carrier signal, and any other signals or noise which may lie without its pass band.

The remaining secure channel signals passing through band pass filter 40 are directed to tuned band pass filter 50. Tuned band pass filter 50 has a very narrow pass band, on the order of 6 mhz. The center frequency of the pass band can be adjusted by means of varying the voltage on varactors (variable capacitance diodes). This adjustment is also made in response to the position selected on the secure channel selector switch 38. Selector switch 38 can suitably operate a potentiometer or similar element in order to vary the varactor voltage, (varying the pass band frequency of the band pass filter 50) as a function of the channel selected.

The various voltages applied to the varactors in response to the selector switch positioning are such that when the selector switch is turned to a particular secure channel, the pass band of tuned band pass filter 50 will be centered on that selective secure channel, while substantially rejecting all other frequencies.

From tuned band pass filter 50, the selected secure channel carrier and its modulated component is directed to double balanced mixer 60. The use of double balanced mixer 60 further eliminates any spurious signals which may be present with the secure channel signals. Double balanced mixer 60 provides a high dynamic range capability for the secure channel signal. The output of crystal controlled local oscillator 70 is combined by mixer 60 with the carrier signal of the secure channel to convert the secure channel signal to that of a standard television broadcast channel, such as channel No. 12.

Crystal controlled oscillator 70 is a transistor oscillator. The oscillator also includes four frequency control crystals, each of which has a particular overtone resonant frequency which, when mixed with the appropriate one of the secure channel midband carriers, converts that channel to a standard broadcast channel, which can be directly received by the receiver. It has been found that a preferred standard channel to which the signal is ultimately converted is standard television channel 12 which comprises the band of 204 to 210 mhz. In channel 12, the video carrier frequency is 205.25 mhz while the sound carrier frequency is 209.75 mhz.

The number of crystals for oscillator 70 and consequently the number of precisely controlled oscillator frequencies corresponds to the number of secure channels on the cable input which may be selected by the selector switch 38. Each crystal is provided with separate diode switching apparatus. When a signal, for example, 18 volts is applied to a given diode switch, the switch connects one of the crystals into the tank circuit of the local oscillator. Selector switch 38 directs the switching and voltage to the switch associated with that crystal which is suitable for receiving the selected channel.

If the logic circuitry 30 has been directed by the command portions of a properly addressed command word to enable the reception of a selected channel, the logic circuit output will generate an output to enable the oscillator transistor to function as an oscillator. Selector 38 directs the logic output corresponding to the selected secure channel to the oscillator. If the logic circuitry has been enabled to make possible the reception of secure channel by an output signal corresponding to that secure channel, then the oscillator will be enabled by the logic output when selector switch 38 is turned to that secure channel. Thus the selector switch directs the logic for a given channel to the oscillator when the selector is set to the given channel. At the same time the selector enables the frequency control crystal for the frequency of the given channel.

The frequency converted signal (converted to channel 12 for example) which bears information from one of the secure channels, is then directed to IF amplifier 90 which has an IF frequency corresponding to the band of channel 12, for example. From there it is passed to IF filter 80, which further strips off extraneous signals and noise. The signal which has been frequency converted to channel 12 signal is now ready for reception. The frequency converted signal is directed back through diode switch 10 from which it is conducted to the output of the tuner converter system and directly to the television receiver input where it may be received when the television receiver is set to receiver channel 12.

Several additional features of the converter-tuner system of this invention are particularly noteworthy. The secure channel carrier frequencies are selected in the midband range of the television channels between the upper and lower bands of channels. The preferred embodiment of the converter-tuner utilizes midband channels A, C, E and G, as designated by the Federal Communications Commission. These channels are each 6 mhz in width and have video carrier frequencies of 121.25, 133.25, 145.25 and 157.25 mhz. respectively.

These channels have been selected according to the criteria that, when mixed with the appropriate oscillator frequencies to convert them to channel 12, the number of the harmonics of the various local oscillator frequencies falling within the midband is at a minimum. This is desirable since the local oscillator radiates whatever frequency it is generating into adjacent portions of the circuitry. This can have the effect of putting spurious signals on the main cable system, which signals, lying within the midband, are potentially receivable by other units on the cable system. Thus, causing noise and other interference could result. The reason for this is that filters 40 and 50 always pass a band of secure channel frequencies lying within the midband.

In order to enable the proper conversion of secure channel frequencies A, C, E and G, for example, local oscillator 70 is conditioned to generate frequencies of 84, 72, 60 and 48 mhz. The only harmonics of these frequencies which are in or near the frequencies of channels A, C, E or G are the second harmonic of 72 mhz and the third harmonic of 48 mhz, each being 144 mhz. This is, therefore, a particularly troublesome frequency. This harmonic frequency can be nulled by providing filter 50 with a resonant circuit tuned to pass 144 megacycles. The resonant circuit resonates at that frequency when it is presented with the 144 mhz harmonic. The resonant circuit is constructed to apply the radiated signal to filter 40 180° out of phase with the 144 mhz harmonic signal being radiated directly by the oscillator. This has the effect of bucking or nulling out the unwanted frequency, which otherwise could get onto the cable, or into other elements of the circuit.

In conventional frequency conversion systems, the local oscillator signals are higher than that of the carrier signals with which they are mixed. This condition has the effect of requiring that substantially high local oscillator frequencies be developed. Such high local oscillator frequencies can require complex circuitry if crystal is to be used. Such an arrangement necessitates the provision of extensive filtering components to block unwanted harmonics. The necessity for such extensive filtering is eliminated in the converter-tuner in which the local oscillator frequencies are selected to be below those of the secure channel carrier signals on which the information to be viewed is modulated.

Where the local oscillator is required to provide frequencies which are higher than the carrier frequencies with which they are to be mixed, frequency multipliers are also often employed. Extensive shielding may be needed in order to block the lower fundamental and harmonics which may lie in the region of the midband frequencies. Thus, the use of a local oscillator frequency below that of the midband secure channel can reduce or eliminate these problems.

The crystal controlled local oscillator being relatively drift-free is not prone to affect or confuse the fine tuning of the television receiver. A local oscillator not having crystal control may have excessive drift. This could require that fine tuning be provided separately for the tuner converter system. An improper adjustment of such fine tuning could make it impossible to fine tune the television receiver to receive the converted signal. Crystal control of the local oscillator eliminates this problem.

Moreover, the converter-tuner is capable of providing a signal to the mixer and ultimately to the television receiver which is considerably cleaner than that which was previously available. The reason for this is the extent of filtering used. Band pass filter 40 first limits the signal passing through it to those of a portion of the midband corresponding to the secure channels. The tunable band pass filter operated by the varactor further narrows the pass band of the signal transmitted to the mixer. The mixer itself is of the double balanced type which further eliminates extraneous signals and noise. Lastly, the IF of channel 12 is filtered one last time before being presented to the input of the television receiver.

The details of the tuner-converter are shown in FIG. 4, which is a schematic of the entire tuner-converter system. In the upper left portion of FIG. 4 is the command amplifier 20. The tone code signal is coupled into the circuit by capacitor C 10 and resistor R 10 and provides a 200 KHz output through capacitor C 29 by virtue of detector diode 29. The amplifier encompasses transistors Q 10, Q 11 and Q 12, which provide three stages of tuned RF amplification. The output of transistor Q 12 is coupled to diode detector 29 which is in turn connected to a low pass filter consisting of coil L 15 and capacitor C 39. The output of the 200 KHz amplitude modulated carrier through capacitor 28 coupled by the filter to a low pass filter comprising resistor R 24 and capacitor C 30. The purpose of this is to develop a DC voltage at the base of transistor Q 13 which is proportional to the RF energy applied at the input and therefore proportional to the DC components of the signal being developed at diode 29. Therefore, transistor Q 13 serves as an automatic gain control amplifier which provide a voltage proportional to the amount of voltage developed across capacitors C 39 and C 30.

The DC voltage developed across capacitor C 30, as a result of rectifying the RF energy across diode 29 is a function of the amount of signal strength applied back at the input of transistor Q 10. This DC energy is amplified by transistor Q 13, filtered by resistor R 26 and capacitors C 32 and C 33, and reapplied as an AGC control voltage through resistor R 17 to transistor Q 11 and through resistors R 17 and R 15 to transistor Q 10 at the control gates.

The purpose of the command amplifier 20 is to detect and amplify any 200 KHz amplitude modulation on the command carrier, which is the input to both the amplifier converter-tuner. This is one way of providing the command words which are directed to each converter-tuner unit in the entire system. The 200 KHz pulses thus modulated on the carrier (which is in the neighborhood of 115 mhz. are the pulses or tone bursts which are applied to the logic circuitry, hereinafter described, which controls the converter-tuner unit. A suitable way of producing these 200 KHz tone bursts, for example, is to intermittently introduce a 114.8 mhz. carrier with the 115 mhz. carrier.

The diode switch 10 includes PIN diodes D1–D5. The coils L1, L2 and L3 and related capacitors C8 and C9 are provided as the means by which these diodes can be forward or back biased as desired to direct a signal through the tuner or directly through the switch to the output to the television receiver.

If a positive voltage is applied to the point directly below capacitor C 3 (the on condition), this will forward bias diodes D1, D3 and D5 and back bias diodes D4 and D2. In this condition diodes D2 and D4 both become a high impedance; diodes D1, D3 and D5 becoming low impedances. This condition yields an effective blocking of the input signal from the output terminal by providing a path for the input signal towards capacitor C9, not through diode D2; however, any current that leaks through diode D2 will be shorted to ground by diode D3. The high impedance at diode D4 yields further blocking.

An signals passing through the converter and returning back from the converter toward the output terminal through capacitor C8 will find a low impedance path at diode D5 through capacitor C7 to the output terminal.

On the other hand, if a voltage is applied at the terminal located directly below capacitor C5 and coil L2 (the off condition), the situation becomes reversed. A back bias is applied to diode D3, raising the input impedance and therefore removing any shunt effect. A forward bias is applied to diodes D2 and D4 which in turn makes these low impedences which provide a through path from the cable input to the output to the TV receiver. Therefore, in this off mode diodes D1 and D5 are back biased because of the low impedance to ground reference provided by resistors R 6 and R 7. As a result, the current flow through diodes D2 and D4 tends to back bias D5 and D1. This effectively opens the circuit and removes any load to the input or the output which might be presented by the tuner elements. When the switch is in the on condition, signals pass through the tuner. When the switch is in the off condition, signals pass directly to the switch through the switch and are isolated from the tuner, including from the tuner's characteristic impedances.

When diodes D1, D3 and D5 are forward biased, signals applied at the cable input through capacitor C1 pass through diode D1, and then through capacitor C9. They are not shunted by resistor R6 because of the high impedance or by coil L1 because of the high impedence. Instead these signals are applied directly to the junction of coils L40 and L41 which, in conjunction with capacitor C41, coil L42 and the other related elements extending down to coil L46, provide a band pass filter 49 (FIG. 5) Filter 40 effectively passes frequencies between 120 and 165 mhz. and substantially rejects all frequencies outside that band.

The RF ground of capacitors C47 and C50 and tie point characteristics of capacitors C48 and 49 together comprise a tune band pass filter 50. The center frequency of the pass band is determined by the selected voltage applied at the junction of capacitor C47 and resistor R45, which influences varactors D40 and D41. This voltage is delivered from voltage dividers (resistors R40, 41 and 42) through a wafer of channel selector switch 38. The channel selector switch, simply picks the voltage available on the voltage dividers depicted at R40 and R41 and R42 which are in turn supplied a voltage which is regulated (to 18 volts for example) by the zener diode D42. The output of the potentiometer will, depending upon the channel selected, determine the capacitor of the varactors in the filter and cause the pass band of filter 50 to be centered on the channel selected. The coils L51 and L52 provide some isolation between the tuned circuit elements and the input and the output interface circuits to permit more practical control of the band width of the tuned circuit.

The tuned circuit has an output band width of approximately 6 mhz. the tuned circuit output is applied to the input of the double balanced mixer which include transforms T60 and 61 and diodes D69–D72. The input to mixer 60 which is driven by the local oscillator is applied through capacitor C72 to the center point of the balanced transformer T61. The unbalanced output of this double balanced mixer appears at a phono jack 61 (for test purposes only) and is subsequently applied to the tuned input of transistor Q80. Transistor Q80 is the active input in the channel 12 IF amplifier 90.

The local oscillator 70 includes transistor oscillator Q60. Transistor Q60 is biased by resistor R70, bypassed by capacitor C70 and its base feed is controlled by diode D68 and resistor R69. Transistor Q60 oscillates by virtue of tuning the base with a selected crystal of crystals X 60, 61, 62 and 63 for the desired frequency and by tuning the collector with a parallel resonant LC circuit. The four parallel resonant circuits each include one of coils L60, 61, 62 and 63. The desired oscillator frequency is an overtone of the base of the crystal. For example, in order to operate the 48 mhz. section a switching voltage is applied through capacitor C61 and and resistor R64. This DC voltage continues on through resistor R60 and forward biases diode D60. This connects the X60 crystal (48 mhz.) to the base of Q60. The same voltage forcing current through coil L60 forward biases diode D61, connecting coil L60 to the collector. Coil L60 in turn parallel resonates with capacitor C71 to provide a parallel tank circuit operating at 48 mhz. Hence the oscillator operates at 48 mhz. To change the frequency the point at which the switching 18 voltage signal is applied is changed. If the switching voltage is supplied through capacitor C67, it would forward bias only the diodes D66 and D67. This would bring into play the 84 mhz. crystal X63 and the coil L63, also parallel resonating with capacitor C71. The point of application of the switching voltage is determined by the selector switch position. Mechanical or electrical switching is provided to place the switching voltage on that terminal of the terminal connected to resistors R64, 65, 66 and 67 which connects the proper crystal to the oscillator frequency converts the selected channel to channel 12.

The output of this oscillator is coupled through capacitor C72 to a mixer 60. The output of the mixer which is applied directly to the tuned input of transistor Q80 is amplified by the tuned IF amplifier 90 and applied to the output through a three stafe tuned IF filter 80 including the components beginning with the coil L82 and ending with coil L85, in conjunction with capacitor C91.

Resistors R86 and R87 provide impedance matching between filter 80 and the output to develop a selected output impedance such as, for example, 75 ohms. This signal progresses from resistor R86, to capacitor C8, and then to diode D5, which has been forward biased by the on command to the diode switch.

The RLC circuit of coil L64 and resistor R75 and capacitor C75 is resonant to an unwanted band oscillator harmonic frequency such as for example, 144 mhz. This circuit applies the harmonic in reverse phase by capacitive or inductive coupling to filter 40. Thus bucking signal cancels out the unwanted harmonic signal emitted by the oscillator, thereby preventing its intrusion onto the main cable or elsewhere.

Description of Logic Circuitry

Figure 6:
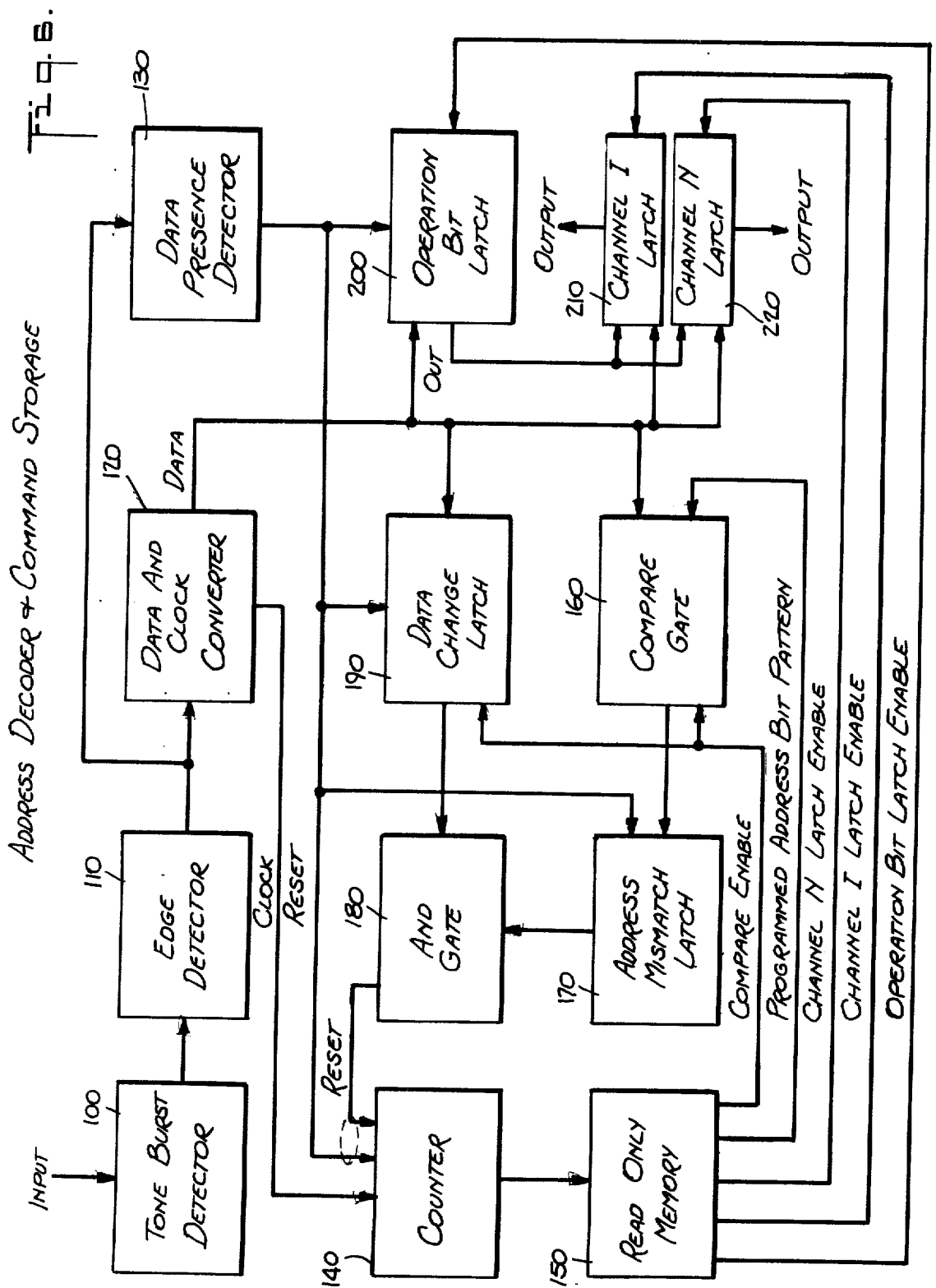
FIG. 6 is a block diagram of logic circuitry designed for use in connection with the converter-tuner of this invention.

FIG. 6 shows a block diagram of the basic control logic circuitry. Command tone bursts are the input to tone burst detector 100 from the command amplifier of the convertor unit. These command signals (for example, of a frequency of 200 khz) are derived from the incoming information on the main cable in the fashion described above. The information on the command signal tone bursts is represented in a split phase mark digital fashion of encoding.

Tone bursts detector 100 serves to provide an output response of a rectangular configuration, the duration of the higher output stage corresponding to the duration of the command signal tone bursts delivered to the input of the tone burst detector. Tone burst detector 100 is constructed such that it imparts a sharp or "clean" definition to the input pulses. The tone burst pulses generated by the tone burst detector are delivered to edge detector 110 which emits a pulse of short duration each time the output of the tone burst detector changes state. These edge signals are then directed to clock converter 120.

Data and clock converter 120 derives from the edge signals both a return to zero data pattern and a coherent clock signal from the split phase mark input. Thus, data and clock converter 120 generates a clock signal pulse at the beginning of each bit cell of the split phase mark signal input to it, and additionally, provides a data signal within each bit cell which indicates whether the bit is a logical one or a logical zero. Information is sent on the cable of the system in command words consisting of a succession of bits, part of which are allocated to address, and part to command functions.

Tone burst detector 100 exhibits a bi-level output which assumes one state when the input tone burst is present and the opposite when the input tone burst is absent.

The data signal generated by the data and clock converter 120 changes state at every bit cell boundary and at the midpoint of every logical one bit. It remains constant for the duration of every logical zero bit. This is the definition of split phase mark coding. The data and clock converter 120 generates an RZ data output which consists of a true pulse during each one bit and no pulse during each zero bit. The clock output signal is simply a rectangular pulse emitted at the beginning of each bit cell.

Data presence detector 130 is a retriggerable one shot device whose output becomes true when a first edge pulse is input to the data presence detector. The output becomes false only if succeeding edges do not appear within the time interval of the one shot of the device. The one shot time is set to be a period longer than the maximum time between edges when logical bits forming words are being transmitted to the input of tone burst detector 100. Data presence detector 130 emits a reset signal if a bit does not appear within the one shot interval, indicating the end of a particular command word. The effect of this reset signal will be discussed below.

The clock signals are input to counter 140. Counter 140 is a binary counter which advances one step with each successive clock pulse. The output of counter 140 drives a read only memory 150 which has a plurality of outputs. Read only memory 150 puts out a unique word on its group of outputs for each discrete state of the counter. Thus, the various outputs of the read only memory assume a set of profiles, each of which profiles is characteristic of one state of counter 140. If only one output is considered and the counter is put through each of its successive states, the one output of the read only memory which is considered will assume a succession of states, this succession of states forming a logical word, successive bits of which can be used to carry information.

The read only memory is preprogrammed in one of its outputs, to output the assigned address bit pattern of the particular converter unit with which the read only memory is associated. In this invention, the particular output of the read only memory which is designed to carry the address bit pattern will carry the address as a logical word during those successive states of counter 140 which are assumed during the address bit cells of the command word.

It can therefore be seen that, as counter 140 progresses under the triggering of the clock signals through a succession of its states, which states correspond to the address bit cells, there will be generated at one output of the read only memory a programmed address bit pattern. This pattern is made unique to the associated converter unit. Therefore, under only the triggering of the clock pulses, each unit automatically generates within itself its own address.

The system is equipped with further logical elements which serve to detect whether the data coming in during the address portion of the command message transmitted is in fact its own address. It does this by generating its own address internally under the stimulus of the clock and by comparing the incoming data (which contains the address of the address converter unit) with its internally generated address and detecting whether the two match.

This comparison takes place in compare gate 160. Compare gate 160 receives both the incoming data signals from the clock converter 120 and also the programmed address bit pattern generated by the read only memory. When these two signals do not match, compare gate 160 transmits a signal to address mismatch latch 170. Address mismatch latch 170 when provided with a signal from compare gate 160 generates a further signal which is input to AND gate 180.

AND gate 180 has one more input extending to data change latch 190. AND gate 180 is constructed such that it emits a signal which resets counter 140 when signals are received by AND gate 180 simultaneously from both mismatch match 170 and data change latch 190. The generation of the reset signal turns counter 140 back to its zero position, and prevents counter 140 from progressing any further in the program or responding in any way to the clock pulses, until the end of the command message being processed.

The function of data change latch 190 is as follows. It is contemplated in this embodiment that there be one particular address which may be sent from the command source and transmitted to the logic circuitry which will cause all of the converter unit to which the signal is directed to respond to the command information within the signal (the command information, as will be explained below, being transmitted in bits of the command message following the address bits). That address is simply the one in which each address bit is a logical zero.

It is evident that, under these conditions, it is undesirable for a reset signal to be generated in all cases in which the internally generally address and the received address do not match. The reason for this is that, quite possibly, the address actually transmitted may be the all zero or "all call" address to which it is desirable that all converter units respond. These conditions can be implemented by rendering data change latch 190 simply a logical element which generates an output only after a logical one signal in the address data received has been detected. Once a logical one signal has been detected, data change latch 190 locks in its condition of providing an output, until it is reset. Resetting does not take place until the command message has been terminated. The termination is sensed by the data presence detector 130. It can be seen that if no logical one bits are present in the address portion of the command message received, and gate 180 can never be satisfied, and the reset pulse will not be sent to counter 140.

The remaining outputs of the read only memory are also preprogrammed to in turn program the operation and other latch gating functions of the unit. It is important to recognize that the maximum number of bits in each command transmission is limited by the number of stages of counter 140. In the preferred embodiment, a 32 stage counter has been employed. Therefore, each command message can be a maximum of 32 bits in length. Of these 32 bits, the first 24 bits have been appropriated to carry the address information being transmitted. Therefore, with respect to that output of the read only memory which is designated as the preprogrammed address bit pattern output, one address may appear only in the first 24 states of that output, as determined by the preprogrammed nature of the read only memory.

It is noted that it would be undesirable for comparison of the internally generated address bit pattern bits and the incoming bits to continue after the command portion of the command word has begun. Therefore, another output of the read only memory is programmed to send a "compare enable" to both the data change latch 190 and compare gate 160, during only the address portion of the command word, i.e., the first 24 bits. During that period, the compare enable signal is a one and it serves to activate the data change latch and the compare gate. After 24 bits, the compare enable signal changes to a state which disables both the data change latch and compare gate.

It can be seen from the foregoing that if an individual unit detects that its own address is actually the one being sent in the address portion of the command word, it will then stop scrutinizing the incoming signals, and merely execute the commands which are received thereafter. Thus, the way in which an individual unit is prevented from responding to the commands in a command word not addressed to it is for the counter 140 to be reset in response to a signal from compare gate 160. This halts any further progress of the unit through the command message and thus it can never get to the command bits. It could, however, receive and respond to the command portion of the command information word were it not for the cessation of its execution of the program by way of counter 140.

It is now assumed that the unit discussed has progressively compared each element of the 24 address bits of the command word and discovered that it is indeed the unit being addressed. It will proceed through the remainder of the program and execute the command which is carried as part of the command word. the next bit immediately following the last address bit actuates still another output of the read only memory. This bit, called "op" or "operation" bit, is true for only one bit i.e., the bit immediately following the address portion of the command word, in this case the 25th bit. The occurance of the operation bit, by way of the "operation bit latch enable" output of the read only memory 150, is transmitted to the operation bit latch 200. Responsive to the reception of the operation bit, operation bit latch 200 emits a signal to each of a plurality of channel latches 210, 220. The signal of operation bit latch 200 represents the state to which channel latches 210 and 220 will be set if they are enabled by the state of the data signal in successive bits of the command word. The data is transmitted simultaneously to the second enable line of each channel latch.

Each channel latch has still another enable input. Each channel latch is tied to a different output of the read only memory 150 by "channel latch enable" lines. Each "channel latch enable" line carries an enabling signal for only one bit of the command word. Moreover, the "channel latch enable" signal for each channel latch is present during a different bit for each channel latch. Each channel latch will be fully enabled to assume the state of the op bit latch 200 only when it is both enabled by the data incoming to it from data clock converter 120 and by its individual "channel latch enable" signal from the read only memory 150.

This operation, in a sample instance, can be described as follows. In bit 25, the op bit eminates from the read only memory, actuating the op latch 200 to provide a status signal to each of the channel latches 210 and 220. The op bit latch signal is then present throughout the entire remainder of the command word. Data arrives simultaneously at each channel latch throughout the remainder of the command word. During bit 26, for example, and only during that bit, the read only memory is programmed to emit the channel 1 latch enable signal. Therefore during that bit, and only that bit, inputs are present on the channel 1 latch from the op bit latch and from the read only memory. Therefore, during that bit the channel 1 latch is enabled to assume whatever state the "op bit" latch presents if the corresponding data bit is true to also enable the channel latch. It will not assume the state of the "op bit" latch in any other bit, because, before and after bit 26, the "channel 1 latch enable" signal from the read only memory 150 does not exist. In like manner, other channel latches can be selectively enabled by their corresponding data bits during the remainder of the command word.

Each of the channel latches has an output having one of two possible states, the state of which being dependent on the condition of the "op bit" latch during the time the channel latch is enabled by the data bit and by the "channel latch enable" signal. Each state of the outputs serves either to enable or disable the associated unit with respect to reception of the channel associated with the channel latch whose output is involved.

Figure 7:
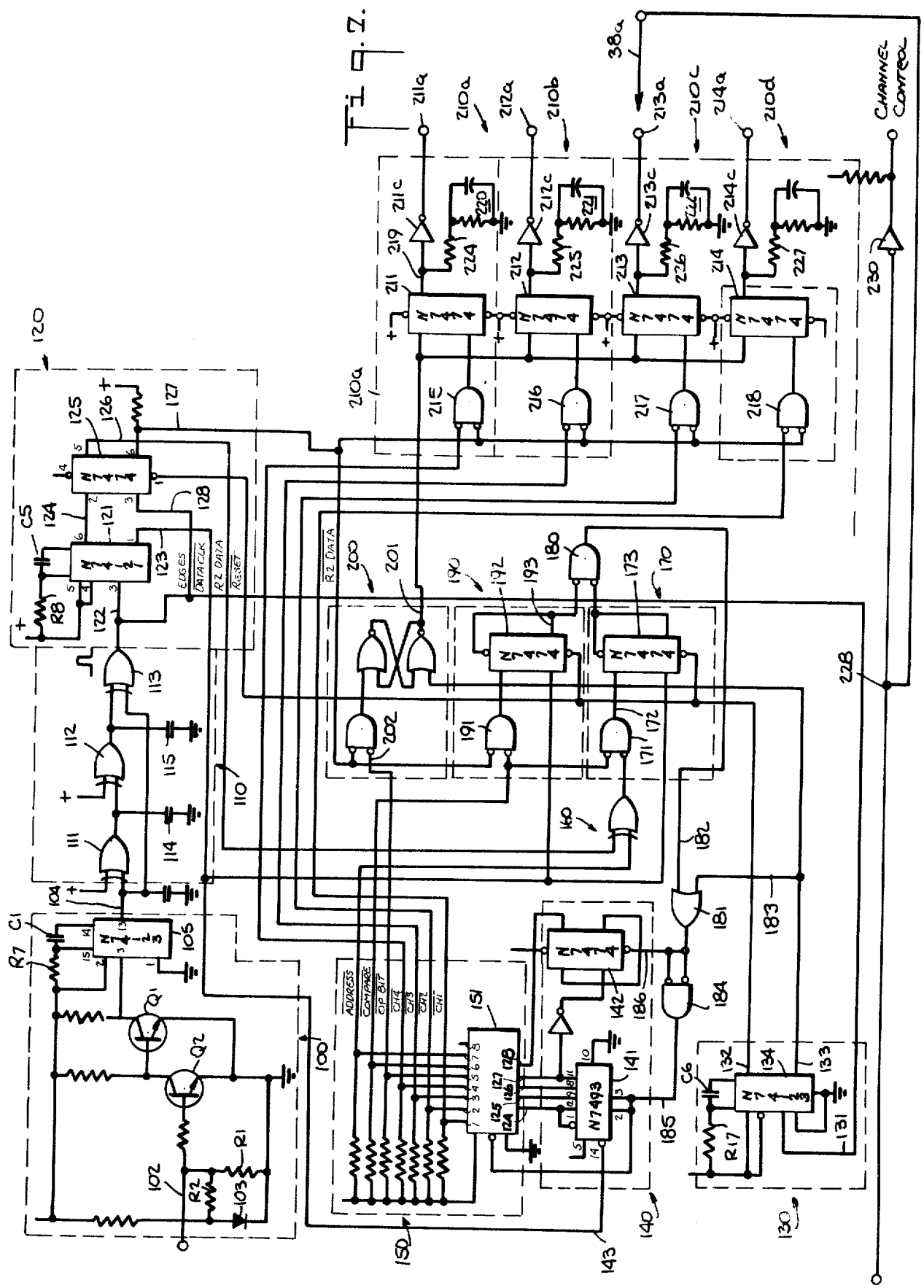
FIG. 7 is a schematic drawing of the logic circuitry designed to be used in connection with the converter-tuner of this invention.

The circuitry of the logic of this system is shown in FIG. 7 which is a schematic drawing of that circuitry. In the upper left-hand corner is located tone detector 100. Tone detector 100 is fed through line 102 bursts of alternating voltage derived from the cable line incoming from the command central station. The function of tone detector 100 is to render a rectangular wave output at terminal 13 of integrated circuit 105. The output is at a high value (for example about 5 volts) when the tone is present and at a low value (for example approximately ground) when it is not.

The purpose of using the tone detector 100 is that regardless of the state of the transfer function of the equipment, which might give rise to some distortion in the incoming tones, the output can still be a clean very sharply defined signal, i.e., it will very closely approximate a rectangular wave, notwithstanding there may be some distortion on the input. Tone burst detector 100 also includes transistors Q2 and Q1. Resistors R1 and R2 are used as a voltage divider to split the voltage appearing across diode 103, which voltage, for example, can be approximately 0.7 volts. This means that a threshold value is provided for the base of transistor Q2. Transistor Q2 is selected to fire at about 0.7 volts. Therefore, to fire it it is only necessary to provide about 0.4 volts on line 102. This renders the tone detector quite sensitive to detect the presence of small voltages in the input tone bursts, such that it may respond with only a minimum of phase distortion in its output.

The firing of transistor Q2 causes transistor Q1 to become nonconductive, causing the appearance of a true signal on terminal 3 of integrated circuit chip element 105. This integrated circuit chip, for example, is of the type known in the art by the designation "N74123." It is a "retriggerable monostable multivibrator with clear," that is a "retriggerable one shot" device. Thus when it is triggered at terminal or pin 3, it immediately produces an output at terminal 13 on line 104 which endures for a predetermined period of time. If the trigger pulse appears again at terminal or pin 3 before the expiration of that time period, then the output of pin 13 will be maintained high. If no trigger comes to pin 3 within the time period, output pin 13 on line 104 will fall to near ground again. The time limit between necessary retriggers is established by the reactance elements, resistor R7 and capacitor C1 which are associated with integrated circuit 105. This kind of "retriggerable one shot" is preferred to the use of reactance elements, as in a filter, to hold the output above a given level for a transient. The reason for this is that such reactance elements can require an excessive amount of time in order to get the output up to the required value. With this embodiment, time delay in falling is achieved without a corresponding delay in the response of the output to the input triggering pulse.

Edge detector 110 provides a sharp, narrow edge pulse whenever the output state at line 104 goes from low to high or high to low. This is done by two successive inversion and delay steps, followed by an exclusive OR comparison. Exclusive OR gates 111 and 112 are connected as inverter with one input of each attached to a constant voltage source. Capacitors 114 and 115 provide the delay function. The output of exclusive OR gate 112 is one input of exclusive OR gate 113. The other input of gate 113 is the raw output of the tone burst detector 100 appearing at line 104. Thus, gate 113 has two inputs, each carrying the signal from tone detector 110, but one of them being slightly delayed.

This means that every time the output on line 104 changes state, gate 113 will output a short pulse indicating an edge.

Figure 8:
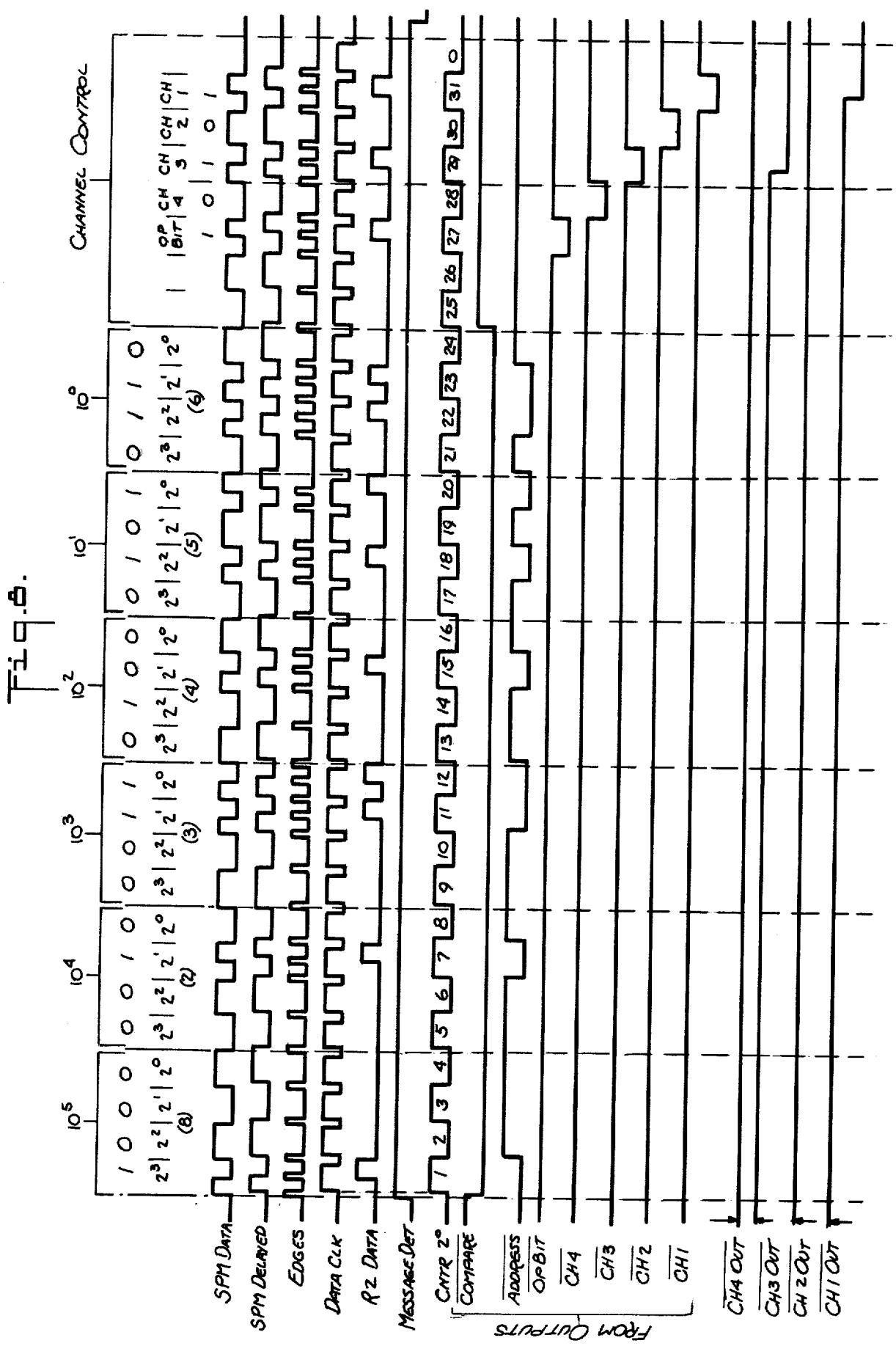
FIG. 8 depicts graphical time-based representations of various signals appearing within the logic circuitry illustrated in FIGS. 6 and 7.

It should be noted that the information dealt with in the logic system herein described is encoded as biphase mark or split phase mark information. The definition of such encoding is that to indicate a logic one bit, the value of the signal makes a transition somewhere near the middle of the bit cell. If the logical bit to be transmitted is a zero, the value, whatever it is, remains the same throughout the entire bit cell. Thus, it is not the level (up or down, high or low) of the signal which carries the information in split phase mark encoding, but only the fact of whether or not a transition in level occurs during the middle of the bit cell under consideration. Split phase mark data is illustrated in the uppermost wave form shown in FIG. 8, entitled "SPM DATA". For example, the first 12 bit cells shown in this drawing carry their respective values of 1, 0, 0, 0, 0, 0, 1, 0, 0, 0, 1, 1. The line entitled "SPM DELAYED" illustrates the wave form which appears at the output of gate 112 in the edge detector. The line described as "EDGES" represents the wave form of the output of gate 113.

Note that in SPM DATA, there is always a change of state at the end of each bit cell, regardless of whether there is also a transition in the middle. Thus, an edge appears at the beginning of each bit cell, regardless of whether the bit cell contains a logical zero or a logical one. If, however, the bit contains a logical one, there is also a transition, and consequently another edge in the middle of that bit cell.

In order to derive a clock signal which is simply a pulse initiated at the beginning of each bit cell and to isolate any additional transitions that may take place within individual bit cell which bear 1 logical information, integrated circuit 121 is employed. Circuit 121 is a "chip" identified by the designation "N74121". It is a "monostable multivibrator", that is a "one shot" device; but not retriggerable. That is to say, when an edge pulse appears at the output gate 113, it is transmitted to circuit 121 over line 122.

With the arrival of each edge pulse at 122, a clock signal is output therefrom on line 123. This signal is a pulse which is programmed by proper choice of resistor R8 and capacitor C5, to last for 75% of the duration of the bit cell. It has been found that a bit cell of 1 millisecond is appropriate for use with this device, so that the endurance of the signal appearing at line 123 which results from a pulse at line 122 is approximately three-fourths millisecond. Since circuit 121 is not retriggerable, it simply produces an output which rises when a pulse appears at line 122 and falls three-fourths millisecond later, regardless of any intervening pulses.

Therefore, it can be seen that circuit 121 serves to provide a clock signal which appears only at the beginning of each bit cell, and is uneffected by the additional transitions which take place in logical bit cells which contain logical 1 information. The inverse of the clock signal appearing at line 123 appears also at line 124. Having derived a clock signal which is initiated at the beginning of each bit cell, it remains to derive a signal which isolates the data appearing in each bit cell, i.e., indicates whether there is or is not a transition in the middle of the bit cell. This is done by means of integrated circuit 125 which is a dual D-type edge triggered flip-flop designated N7474. In order for there to appear an output on either of lines 126 and 127 (each of which is the inverse of the other) there must be a signal at its input 124 and at its other input 128. When this condition takes place, output 126 goes true and output 127 goes false for the duration of the bit cell.

It can therefore be seen that the only edges to which circuit 125 will respond with an output are those edges which occur in the middle of a bit cell since in all cases the output 124 of circuit 121 has fallen to zero before the end of each bit cell. Therefore in the case of a one bit, outputs appear at circuit 125 for the last half of the associated data bit, but no such outputs appear in the case of a zero bit. Thus, the transitions indicating the existance of each one bit are by this circuitry isolated to be applied in a manner discussed hereinbelow.

The inverse clock signal is directed to input line 143 of counter 140. Counter 140 includes two integrated circuits. The circuit designated 141 is a "4-bit binary counter" designated as N7493. The circuit 142 is of the type designated N7474 which has been referred to above. counter 141 counts successively with each clock signal received until it counts from zero through 31 bits. The counter will then repeat if other clock signals arrive. The outputs are designated as the five lines 124–128.

It can be seen that counter 140 can provide 32 different addresses by its combined outputs and will traverse each of those addresses if actuated to do so by the arrival of a like number of successive clock pulses. In the disclosed embodiment the addresses of the counter can correspond successively to a binary count from 0 to 31 delievered along lines 124–128.

The outputs of counter 140 are connected to "read only memory" 150 which is a 256 bit field programmable read only memory organized as 32 "words" with 8 bits per word. "Words" are selected by 5 binary address lines 124–128. By way of example, read only memory 150 can include a read only memory device 151 manufactured by Signetics, 811 East Arques Avenue, Sunnyvale, California 94086 and designated as Signetics Type 8223 "FROM 256 Bit Bi-polar Field Programmable Read Only Memory". Thus the read only memory is capable of successively presenting 32 "words" over 8 outputs. The "words" which the read only memory present for each successive binary counter address are preset by conditioning the read only memory 151 before it is installed in the system.

Even though the 8 outputs of the read only memory have been described as comprising a "word" for each binary count input thereto, in the disclosed system the "word" output is not used as an element of information but instead is processed as 8 separate bits which comprise a given "word".

When each output or bit of read only memory 150 is considered separately, it can be seen that for a plurality of successive binary count inputs, each output can comprise a particular binary word. Thus each output 1–7 (output 8 not being used) carries a binary word.

Thus, for example, the read only memory output (line 7) which is connected to the line labeled "address" is conditioned to assure a particular sequence of bits which express a binary number in response to a sequence of binary count inputs. Therefore it can be seen that this logic unit, in response to a clock signal at the counter indicating the beginning of each bit cell, can internally generate a particular address, on the address line, expressed in binary form. Similarly a signal is simultaneously produced on each of output lines 1–6.

If the internally generated address from line 7 matches the address of the associated tuner converter unit, then means can be provided whereby the system can sense the occurence of a corresponding incoming cable transmitted address (designated RZ data). Thus the system determines whether its assigned address generated in the read only memory in response to the clock signal corresponds entirely with the address actually being received.

This is done partially by the use of compare gate 160, which is an exclusive OR gate. Input to gate 160 is the address output of the read only memory and the actual data arriving over the cable. If they are mismatched, a true signal appears at the output of gate 160, which is directed to the inverted input of AND gate 171. The other input of gate 171 is connected to "compare" enable signal from read only memory 150.

This "compare" enable signal is used to limit the number of bits in which the comparison step is executed to only those bits of each command word which constitute the bits which are allocated for the address. Thus, the "compare" enable signal will be present during each of the counts of counter 140 which correspond to the bits constituting the address portion of the command word. When both the "compare" enable signal and a mismatch signal are applied to gate 171, an output is transmitted over line 172 to circuit 173.

Integrated circuit 173 is also a N7474 chip. The other input of circuit 173 is connected to the "data clock" signal transmission line. When the clock pulse and the mismatch pulse are both inputs to circuit 173, the circuit emits a signal which is directed to one input of AND gate 180. The other input of AND gate 180 is connected to the output 193 of circuit 192 which is a component of data change latch 190. Circuit 192 exhibits an output at 193 only when a "one" logical bit appears in the address which is actually received over the data line. This can be seen if one notes that gate 191 has "RZ data" as one input and the "compare" enable signal as the other. The "compare" enable signal as in the case of the address mismatch latch is present throughout the entire period of the address portion of the command word being received.

Therefore, it can be seen that the conditions for an output, at gate 180 are fulfilled whenever the internally generated address fails to match the received address in any of its bit cells, and a "one" signal has been received as part of the address.

The reason for introducing the additional condition that there by an output in response to a mismatch only if there is also a previously received one bit in the address is that it is intended that this system will have an "all call" address capability consisting of zeros. The results of an output on gate 180, as will be discussed below, is a resetting of the counter in the associated unit and a consequent halting of its progress through the program dictated by the received command word. Therefore, if no one bit has yet been received, the incoming signal may still be an "all call", and therefore there is introduced the additional condition for resetting that there has been a received one.

If, however, there has been one bit received, and also a mismatch between the internally generated address and the received address, an output at gate 180 which is directed to the input 182 of OR gate 181 exhibits an output whenever either of its inputs is true. Thus, the appearance of an output at gate 180 will also actuate gate 181 and gate 184. Since there are inverters at the output of gate 181 and at the inputs of gate 184, the appearance of a true at 182 will cause line 185 to go true and will bring 186 close to ground. These are the conditions to resetting circuits 141 and 142, respectively, and thus, if an output exists at gate 180, the entire counter is reset.

Applicants have found that for the disclosed embodiment a 24 bit address code is sufficient. That is to say, the first 24 bits of the received command word constitute the command word of the unit being addressed, and during those 24 bits, the address comparison step takes place. This comparison is enabled by the presence of the compare enable signal from read only memory 150 in a manner as described above. The read only memory is programmed such that, after the 24th bit, the compare enable signal is removed, rendering impossible any further comparison or reset steps. If the unit receiving the address has not been reset in the course of the first 24 bits, the unit is indeed the one addressed. In this condition, the logic circuitry herein described will continue to process the command word. The remainder of the command word contains information relating to actual commands which will be executed by the unit during the succeeding bits of the command word.

The bits immediately following the address bits, in this case the 25th bit, and the corresponding position on the counter, are such that during the 25th bit, the read only memory issues a single "op bit" on the line bearing that label. This signal is directed to input 202 of the "op bit" latch 200. This condition causes "op bit" latch 200 to assume the state of the corresponding data bit and to latch such that an output which reflects this state continuously appears at output 201 until the "op bit" latch is reset. The reset takes place in a manner described herein below. This signal 201 is transmitted to one input of each integrated circuit element 211, 212, 213, and 214 which, for example, can comprise N7474 integrated circuit, circuit element 211, 212, 213 and 214 are parts of channel latches, 210a, 210b, 210c and 210d.

Having latched the "op bit" latch signal onto each of the integrated circuits 211 through 214, it is noted that each of the other inputs to these circuits is preceded by a different one of AND gates 215 through 218. One input of these AND gates is connected to the inverse "RZ data" line and the other is connected to the individual channel enabling line (CH1, CH2, CH3, and CH4) for the particular channel latch with which the gate is associated.

Each channel latch is assigned a particular single bit in the command word received which is that bit in which its channel enable signal is present. That is to say, the channel enable signal for the channel of the channel latch 210a is a one for the bit following the operation or "op bit". Since gates 215, 216, 217 and 218 are AND gates with inverted inputs, each of these gates will have an output only when both the inverse "RZ data" and inverse channel enable (CH4) signals, shown on the drawing, are low (connoting a one bit on each of them). Thus, if, during the period in which inverse channel enable (CH4) is low and inverse "RZ data" is also low, there will then be an input on integrated circuit 211 from gate 215. This input will cause output 219 of circuit 211 to assume the state of line 201. A true output at 219 is connected to the converter-tuner unit to enable the reception of the channel associated with channel latch 210a.

On the other hand, if the received data during the bit in which the channel latch 210a is enabled is a zero, then no output will appear at gate 215, and no change will occur at the output 219. Therefore, the enabling of the channel latch circuits by means of the data and the appearance of the appropriate channel enable signal will cause the associated channel latch to assume whatever condition the "op bit" latch possesses during that bit. Thus, during the command function of the logic, it is possible to individually turn on or off any channel which is desired while being able to leave unaffected any channels which are intended to remain in the same condition.

At the output of each of the integrated circuits of 211 through 214 is a buffer amplifier, these being designated 211c, 212c, 213c, and 214c. These amplifiers serve to isolate the integrated circuit from transients which might be created when switching between the multiplicity of outputs available, which transients might induce the integrated circuit of one of the channel latches to lock in the true state without a command for a true state having been received.

Each of the RC circuits 220, 221, 222, 223 extending between the input of each buffer amplifier (211c, 212c, 213c and 214c) and ground by way of resistors 224, 225, 226, and 227, respectively, tend to hold the outputs of the flip flops of integrated circuits 211, 212, 213, and 214, respectively to ground. This prevents the flip flops from being actuated by loading them on a random basis if the power to the system is sequentially turned on and off. The capacitors of these RC circuits provide an additional benefit in that they serve as short term memories for true inputs to the buffer amplifiers 211c, 212c, 213c, and 214c. The memory effect can prevent the loss of the latched condition in the event of a short term power interruption. Of course, if power is interrupted for a period of time approaching the time constant of a given RC circuit, then the memory effect is lost and any latched channel will become unlatched.

There is also provided a selector switch 38a connected to selector 38 for selective engagement with the outputs of each of the channel latches. The selector switch has other wipers 38b and 38c (FIGS. 4 and 5) which determine which resonant tank circuit is connected to the local oscillator of the tuner to cause the oscillator to generate the appropriate frequency for reception of the selected channel. The wiper 38a connects the "channel latch" integrated circuits to a "channel control" point 228 which is permanently wired to the "channel control" terminal of the base of the oscillator of the tuner at capacitor C73.

If a person switches the selector 38 to a particular channel, he will in effect be requesting the tuner to operate on the particular channel and he will be switching to the channel latch related to the particular channel. The tuner, however, will not operate if inverter 230 has a false output in response to the output of any channel latch integrated circuit (211-214) being false. This is caused by the fact that such a false cannot actuate oscillator Q60.

Where a channel latch is actuated to have a true output in response to the receipt of a command, the true output is inverted by the buffers (211c-214c) to a false and subsequently inverted to a true by inverter 230. A true at the output of inverter 230 serves to activate oscillator Q60.

In the lower left corner of FIG. 7, there is shown data presence detector testor 130. Data presence detector 130 includes a retriggerable one shot 134 (N74123, for example) which is fed from the output of edge detector 110 on line 131. When a period time (determined by resistor R17 and capacitor C6) has elapsed between edges, the output 132 of data presence detector 130 falls. The period of time is set such that it is somewhat longer than on bit, so that when the bits of the command word stop arriving, the data presence detector 130 will sense the absence of the data and apply signals to leads 132 and 133. Signals on these leads serve to reset the address mismatch latch 170, data change latch 190, the data and clock generator 120, the counter 140, and the op bit latch 200. The circuitry is then ready for the reception of a new command word.

FIG. 3 depicts in block form the central system circuit which is used to control the cable distribution system of which the apparatus described herein and above is a part.

The system includes master monitor control 270 which contains the control circuitry for the remainder of the system. Command generator 280 provides a digital word to the master monitor control 270 which generates tone bursts representing the control command words which are desired to be propagated. When a command word is generated, the master monitor control 270 receives it and directs it to RF modulator 290 where it is modulated on the command signal carrier. Modulator 290 also modulates onto the secure channel carriers, the information constituting the program content of each of the secure channels designated here at channels A, B, C. From the RF modulator all these modulated carriers proceed directly to the main cable of the system which is ultimately connected to each of the subscriber stations.

Such stations may include not only individual subscriber locations, but MATV cables, such as in hotels or apartment buildings, and CATV cables such as are now offered in many locations. Thus, all the modulated carriers are contantly input to each of the ultimate viewing locations of the system.

Each of the ultimate viewing locations whether they are in a hotel, apartment building, or private dwelling, has its own unique address which address is always available for transmission by the command generator. Additionally, when the ultimate viewing location is part of a system such as a CATV system, or a master antenna system in a hotel, it may also be assigned in address within that system which need bear no relationship to its ultimate address as determined by the command generator and the master monitor control. According to the front of the system, 24-bit address portion of the command word makes possible the existence of hundreds of thousands of unique addresses for ultimate viewing locations.

Each of the systems within the master system, such as a hotel or cable T.V. system, has a hotel command generator 250 associated with it. The hotel command generator is capable of responding to a keyed in message to generate a signal which is interpretable at the master monitor control 270 as calling for the issuances of a command word addressed to a particular box of the main system. The message signal also contains command information regarding changes of state which are to be executed at the addressed box.

The messages generated by the hotel command generator are passed to the master monitor control 270 by way of standard telephone lines, for example. Modem units 260a and 260b are provided in order to convert the command of the hotel command generator 250 to a form suitable for transmission over phone lines.

If a guest in a hotel calls "room service" and orders a particular program for viewing in his room, "room service" will key in the hotel command generator a code corresponding to that guest's room. The hotel command generator 250 will then generate a command signal corresponding to the guest room and the command which is to be ordered. The signal is then passed to the master monitor control 270. Master monitor control causes the command generator 280 to generate a command word comprising tone bursts which contain the address of the guest's room convertertuner and also contain information as to the change of condition be ordered at the viewing station. The command passes through the master monitor control 270 and the RF modulator 290 where it is modulated on the command signal carrier and then transmitted to the guest's room by the hotel cable system. The converter-tuner in the guest's room decodes the address thereby determining that it is indeed the addressee of the command, and responds to the command, thereby rendering the proper channel viewable by the guest.

Other ancillary equipment may optionally be associated with the master monitor control 270. Magnetic tape facility 310 is provided to make a tape record of the occurrence of the command signal. Included in the record is the address of the viewing station, the command to be executed, and the time which is made available to the master monitor control by means of time clock 300. A line printer 320 can also be provided to make a visual copy of the record. The material generated by the magnetic tape facility and line printer may be used for logging, accounting purposes, audience survey data, and the like.

The disclosed logic control system can be applied to environments other than cable television systems since the transmitted and decoded commands can relate to various types of destination equipment which are to be selectively actuated from a central command station.

What is claimed is:

1. In a converter-tuner apparatus for selectively converting each of a plurality of cable television modulated carrier signals having different carrier frequencies to a predetermined frequency to be coupled to a television receiver, the converter-tuner apparatus having an input for receiving the carrier signals, a filter connected to the input for passing substantially only the carrier frequencies, a mixer connected to the filter output, a variable frequency local oscillator connected to the mixer, the mixer being adapted to convert separately each carrier signal to the predetermined frequency, the improvement comprising a local oscillator comprising:
   a. a plurality of resonant circuits each being resonant to a different frequency;
   b. a plurality of frequency control crystals each connected to a different one of said plurality of resonant circuits, each crystal being conditioned to oscillate as a function of the frequency of said resonant circuit to which it is connected, said crystals precisely controlling the resonant frequency of said resonant circuits
   c. a transistor oscillator circuit;
   d. a plurality of diode switch means each connected to a different one of said resonant circuits and said crystal connected thereto;
   e. means for selectively actuating each of said diode switch means to connect said resonant circuit and said crystal related thereto into said transistor oscillator circuit; and
   f. means coupled to the local oscillator for coupling a component of a harmonic frequency of the local oscillator in a phase reversed sense into the converter-tuner apparatus prior to the mixer to substantially null the component of the harmonic of the local oscillator from interfering with the carrier signal being converted, whereby the predetermined frequency can be precisely controlled for each of the plurality of modulated carrier signals.

2. A converter-tuner apparatus in accordance with claim 1 in which said filter comprises:
   a. a band pass filter having a band width encompassing substantially only the frequencies of the plurality of cable television modulated carrier signals;
   b. a tunable band pass filter connected between said band pass filter and said mixer, said tunable band pass filter being tunable to a plurality of different pass bands, each pass band encompassing substantially only the frequencies of a different one of the plurality of carrier signals; and
   c. means operably coupled to said means for actuating said diode switch means for selecting one of said plurality of different pass bands of said tunable band pass filter, whereby the band pass filter and the tunable band pass filter can pass reject substantially all frequencies different from the one of the plurality of carrier signals to be delivered to said mixer.

3. A converter-tuner apparatus in accordance with claim 2 in which said means for selecting each of a plurality of different pass bands for said tunable band pass filter comprises:
   a. a variable reactance connected to said tunable band pass filter; and
   b. means for selectively determining the reactance of said variable reactance to obtain each of the different pass bands of the tunable band pass filter.

4. A converter-tuner apparatus in accordance with claim 3 in which said variable reactance comprises a variable capacitance diode, the capacitance of said diode being a function of a control voltage applied thereto and in which said means for selectively determining the reactance of said variable reactance comprises means for varying the control voltage applied to the variable capacitance diode.

5. A converter-tuner apparatus in accordance with claim 1 wherein said resonant circuits and said frequency control crystals include means to provide variable frequencies of the variable frequency local oscillator which are in a range of frequencies below the range of frequencies of the plurality of carrier signals and in which said mixer includes means to provide the predetermined frequency by summing the frequency of a carrier signal and the frequency of the variable frequency local oscillator.

6. A converter-tuner apparatus in accordance with claim 5 in which the carrier signals are in the mid-band range between the lower VHF band and the upper VHF band of broadcast television channels and in which the predetermined frequency to which each of the carrier signals is converted is in the upper band of broadcast television channels.

7. A converter-tuner apparatus in accordance with claim 6 in which the carrier signals are disposed at predetermined locations within the mid-band range between the lower VHF band of broadcast television channels and the upper VHF band of broadcast television channels, each of the predetermined locations of the carrier signals in the mid-band range being selected to require a different local oscillator frequency having harmonics which are substantially displaced from the frequency of each of the carrier signals, whereby harmonic frequencies of the local oscillator are safeguarded from causing interference with the carrier signals.

8. A converter-tuner apparatus in accordance with claim 1 in which said means for coupling a component of a harmonic frequency of the local oscillator in a phase reversed sense into the converter-tuner apparatus prior to the mixer to substantially null the component of the harmonic of the local oscillator from interfering with the carrier signal being converted is coupled to the filter.

9. A converter-tuner apparatus in accordance with claim 1 in which the means for coupling a component of a harmonic frequency of the local oscillator in a phase reversed sense into the converter-tuner apparatus prior to the mixer to substantially null the component of the harmonic of the local oscillator from interfering with the carrier signal being converted comprises:
 a. a resonant circuit substantially tuned to the frequency of the component of the harmonic of the frequency of the local oscillator; and
 b. means connected to said resonant circuit for reversing the phase of the component of the harmonic of the local oscillator to be coupled to the filter.

10. In a converter-tuner apparatus for selectively converting each of a plurality of cable television modulated carrier signals having different carrier frequencies to a predetermined frequency to be coupled to a television receiver, the converter-tuner apparatus having an input for receiving the carrier signals, a filter connected to the input for passing substantially only the carrier frequencies, a mixer connected to the filter output, a variable frequency local oscillator connected to the mixer, the mixer being adapted to convert separately each carrier signal to the predetermined frequency, with the carrier signals being disposed at predetermined locations within the mid-band range between the lower VHF band of broadcast television channels and the upper VHF band of broadcast television channels, wherein the improvement comprises a local oscillator generating different local oscillator frequencies having harmonics which are substantially displaced from the frequency of each of the carrier signals, and means coupled to the local oscillator for coupling a component of a harmonic frequency of the local oscillator in a phase reversed sense into the converter-tuner apparatus prior to the mixer to substantially null the component of the harmonic of the local oscillator from interfering with the carrier signal being received by the receivers connected to the cable system.

11. A converter-tuner apparatus in accordance with claim 10 in which said means for coupling the component of a harmonic frequency of the local oscillator in a phase reversed sense into the converter-tuner apparatus prior to the mixer to substantially null the component of the harmonic of the local oscillator from interfering with the carrier signal being received by the receivers connected to the cable system is coupled to the filter.

12. A converter-tuner appparatus in accordance with claim 11 in which the means for coupling the component of a harmonic frequency of the local oscillator in a phase reversed sense into the converter-tuner apparatus prior to the mixer to substantially null the component of the harmonic of the local oscillator from interfering with the carrier signal being received by the receivers connected to the cable system comprises:
 a. a resonant circuit substantially tuned to the frequency of the component of the harmonic of the frequency of the local oscillator; and
 b. means connected to said resonant circuit for reversing the phase of the component of the harmonic of the local oscillator to be coupled to the filter.

13. A method of selectively converting by a converter-tuner apparatus one of a plurality of cable television modulated carrier signals having different carrier frequencies to a predetermined frequency to be coupled to a television receiver by receiving the carrier signals at the input of the converter-tuner apparatus, filtering the carrier signals for passing substantially only at the carrier frequencies, mixing the filtered carrier signals with a variable frequency local frequency local oscillator signal, the mixing being adapted to convert the one carrier signal to the predetermined frequency, the improvement comprising:
 a. selecting the variable frequencies of the variable frequency local oscillator to be in a range of frequencies below the range of frequencies of the plurality of carrier signals and selecting the predetermined frequency to be equal to the sum of a carrier signal and the frequency of the variable frequency oscillator; and
 b. coupling a component of a harmonic frequency of the local oscillator in a phase reversed sense into the converter-tuner apparatus prior to the step of mixing to substantially null the component of the harmonic of the local oscillator from interfering with the carrier signal being received by the receivers connected to the cable system.

14. The method of claim 13 in which the step of coupling a component of a harmonic frequency of the local oscillator in a phase reversed sense into the converter-tuner apparatus prior to the step of mixing to substantially null the component of the harmonic of the local oscillator from interfering with the carrier signal being received by the receivers connected to the cable system comprises:
 a. providing a resonant circuit coupled to the local oscillator substantially tuned to the frequency of the component of the harmonic of the frequency of the local oscillator; and
 b. reversing the phase of the component of the harmonic of the local oscillator to be coupled to the filter.

15. The method of selectively converting by a converter-tuner each of a plurality of cable television modulated carrier signals having different carrier frequencies to a predetermined frequency to be coupled to a television receiver, receiving the carrier signals, filtering the carrier signals passing substantially only the carrier frequencies, mixing the filtered output with a signal from a variable frequency local oscillator, the mixing converting separately each carrier signal to the predetermined frequency, the improvement comprising the step of disposing the carrier signals at predetermined locations within the mid-band range between the lower VHF band of broadcast television channels and the upper VHF band of broadcast television channels, each of the predetermined locations of the carrier signal in the mid-band range being selected to utilize a different local oscillator frequency of the local oscillator having harmonics which are substantially displaced from the frequency of each of the carrier signals, whereby harmonic frequencies of the local oscillator are safeguarded from causing interference with the carrier signals, and coupling a component of a harmonic frequency of the local oscillator in a phase reversed sense into the converter-tuner apparatus prior to the mixing to substantially null the component of the harmonic of the local oscillator from interferring with the carrier signal being converted.

* * * * *

UNITED STATES PATENT OFFICE
CERTIFICATE OF CORRECTION

Patent No. 3,935,534         Dated January 27, 1976

Inventor(s) David E. Lewis et al

It is certified that error appears in the above-identified patent and that said Letters Patent are hereby corrected as shown below:

Column 8, line 23, "An" should read -- Any --.

Column 9, line 33, after "base", insert -- frequency --.

Column 9, line 36, delete "and" second occurrence;

Column 9, line 55 after "oscillator", insert -- such that the oscillator --.

Column 9, line 61, "stafe" should read -- stage --.

Column 10, line 7, "Thus" should read -- This --.

Column 10, line 23, after "rectangular", insert -- wave --.

Column 11, line 59, delete "match" and insert -- latch --.

Column 13, line 35, after "data", second occurrence insert -- and --.

Column 13, line 40, after "op", insert -- bit --.

Column 14, line 62, "inverter" should read -- inverters --.

Column 15, line 7, "logic" should read -- logical --.

Column 15, line 41, after "output", insert -- of --.

Column 16, line 20, "counter" should read -- Counter --.

UNITED STATES PATENT OFFICE
CERTIFICATE OF CORRECTION

Patent No. 3,935,534  Dated January 27, 1976

Inventor(s) David E. Lewis et al

It is certified that error appears in the above-identified patent and that said Letters Patent are hereby corrected as shown below:

Column 16, line 61, "assure" should read -- assume --.

Column 17, line 64, after "output", insert -- appears --.

Column 17, line 65, after "181", insert -- . Or gate --.

Column 18, line 46, after "of", insert -- each of --.

Column 20, line 3, after "period", insert -- of --.

Column 20, line 51, "front" should read -- format --.

Column 21, line 5, "in" should read -- into --.

Signed and Sealed this

Twenty-fourth Day of August 1976

[SEAL]

Attest:

RUTH C. MASON
Attesting Officer

C. MARSHALL DANN
Commissioner of Patents and Trademarks